(12) United States Patent
Repp

(10) Patent No.: US 6,924,713 B2
(45) Date of Patent: Aug. 2, 2005

(54) HIGH BANDWIDTH MAGNETICALLY ISOLATED SIGNAL TRANSMISSION CIRCUIT

(75) Inventor: John Donald Repp, Doylestown, PA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 10/270,115

(22) Filed: Oct. 15, 2002

(65) Prior Publication Data

US 2005/0062555 A1 Mar. 24, 2005

Related U.S. Application Data

(60) Provisional application No. 60/402,910, filed on Aug. 14, 2002.

(51) Int. Cl.$^7$ ................................ H01P 5/00; H01P 1/15
(52) U.S. Cl. ........................ 333/24 R; 333/103; 333/177
(58) Field of Search .............................. 333/24 R, 177, 333/101, 103; 336/182, 212; 340/641; 360/64; 363/17, 25, 24

(56) References Cited

U.S. PATENT DOCUMENTS

| | | | | |
|---|---|---|---|---|
| 3,668,508 A | * | 6/1972 | Archer et al. .................. 363/25 |
| 5,075,672 A | * | 12/1991 | Stefanov ....................... 340/641 |
| 6,175,461 B1 | * | 1/2001 | Fukuda et al. ................. 360/64 |
| 6,272,025 B1 | * | 8/2001 | Riggio et al. .................. 363/24 |
| 6,697,266 B2 | * | 2/2004 | Poon et al. .................... 363/17 |

* cited by examiner

Primary Examiner—Robert Pascal
Assistant Examiner—Dean Takaoka
(74) Attorney, Agent, or Firm—McDermott Will & Emery LLP

(57) ABSTRACT

Many current electronic systems incorporate expensive or sensitive electrical components. Because electrical energy is often generated or transmitted at high voltages, the power supplies to these electronic systems must be carefully designed. Power supply design must ensure that the electrical system being supplied with power is not exposed to excessive voltages or currents. In order to isolate power supplies from electrical equipment, many methods have been employed. These methods typically involve control systems or signal transfer methods. However, these methods are not always suitable because of their drawbacks. The present invention relates to transmitting information across an interface. More specifically, the present invention provides an apparatus for transmitting both AC and DC information across a high bandwidth magnetic interface with low distortion.

13 Claims, 7 Drawing Sheets

HIGH BANDWIDTH MAGNETICALLY ISOLATED SIGNAL TRANSMISSION CIRCUIT

CROSS-REFERENCE TO RELATED APPLICATION

The benefit of provisional application 60/402,910 filed Aug. 14, 2002 under 35 U.S.C. §119(e), is hereby claimed.

GOVERNMENT LICENSE RIGHTS

The U.S. Government has a paid-up license in this invention and the right in limited circumstances to require the patent owner to license other on reasonable terms as provided for by the terms of JPL Contract 1204510 awarded by NASA.

BACKGROUND OF THE INVENTION

1. Field of the Invention

The present invention relates to transmitting information across an interface. More specifically, the present invention relates to transmitting both AC and DC information across a high bandwidth magnetic interface with low distortion.

2. Background of the Invention

Many current electronic systems incorporate expensive or sensitive electrical components. Because electrical energy is often generated or transmitted at high voltages, the power supplies to these electronic systems must be carefully designed. Power supply design must ensure that the electrical system being supplied with power is not exposed to excessive voltages or currents. In order to isolate power supplies from electrical equipment, many methods have been employed. These methods typically involve control systems or signal transfer methods.

In one method, the power supplies have been electrically isolated from electronic equipment. This has been done using, for example, optical isolation or magnetic isolation. Optical isolation is desirable because of its simplicity. However, the inherent parametric shifting, especially in high radiation environments, often makes this method impossible to utilize. Additionally, optical isolators are typically bandwidth limited to between 10 to 20 KHz.

One type of magnetic isolation method employs magnetic sensors that have an AC signal applied to a winding that is modulated. The resulting signal is magnetically coupled to a winding where the waveform is conditioned by a circuit that is responsible for decoding the modulated signal. Magnetic isolation is ideal for many situations because it can compensate for parametric shifts and high radiation effects with the proper selection of support circuitry. However, magnetic isolation also has disadvantages. The modulation circuitry can be complex, which increases the number of components that are necessary. In addition, the demodulation of a signal is typically subject to non-linearities, which is undesirable in control loop systems.

Another type of magnetically coupled signal transfer involves a self-oscillating, saturating, magnetic-transistor circuit passing information from DC to the MHz region. The nature of these self oscillating circuits is to produce a high duty cycle push-pull action across a transformer winding. During the "on-time," in the linear region (before the transformer saturates), information is passed from primary to secondary by conventional transformer coupling. In this method, signals that are transferred during this "on time" are only bandwidth limited by series parasitic elements. Therefore, this portion of the circuit can be considered "high bandwidth." The portion of time involved in saturation does not pass information from primary to secondary. In fact, this moment in time produces the noise that needs to be filtered out of the desired signal. Although this circuit is very effective, it requires very specialized core material with square loop characteristics. This circuit also requires dual power supplies, with at least one of the power supplies requiring two quadrant operation. This type of sensor is utilized in, for example, the PSDU Battery module—A2100M power subsystem.

A continuing need exists for an apparatus for providing an isolated signal interface in a power converted circuit.

SUMMARY OF THE INVENTION

An object of the present invention is to provide a high bandwidth magnetically isolated signal transmission circuit.

Another object of the present invention is to provide a transmission circuit with low parts count and straight forward operation.

Yet another object of the present invention is to provide ohmic isolation via magnetic coupling.

Still another object of the present invention is to provide a transmission circuit with high bandwidth.

Still another object of the present invention is to provide a transmission circuit that is radiation tolerant.

Still another object of the present invention is to provide a circuit with linear response characteristics.

Yet another object of the present invention is to provide a transmission circuit with low power consumption.

Still another object of the present invention is to provide a transmission circuit that can operate using a single power supply.

The present invention achieves the above and other objects by providing an apparatus for transmitting signal across an interface, comprising: an isolation circuit operatively connected to receive at least one input signal; a rectifier operatively connected to the isolation circuit; and a switching system operatively connected to one end of the isolation circuit to provide an output.

Other and further objects of the present invention will be apparent from the following description and claims and are illustrated in the accompanying drawings, which by way of illustration, show preferred embodiments of the present invention. Other embodiments of the invention embodying the same or equivalent principles may be used and structural changes may be made as desired by those skilled in art without departing from the present invention and the purview of the appended claims.

DETAILED DESCRIPTION OF THE DRAWINGS

Figure 1:
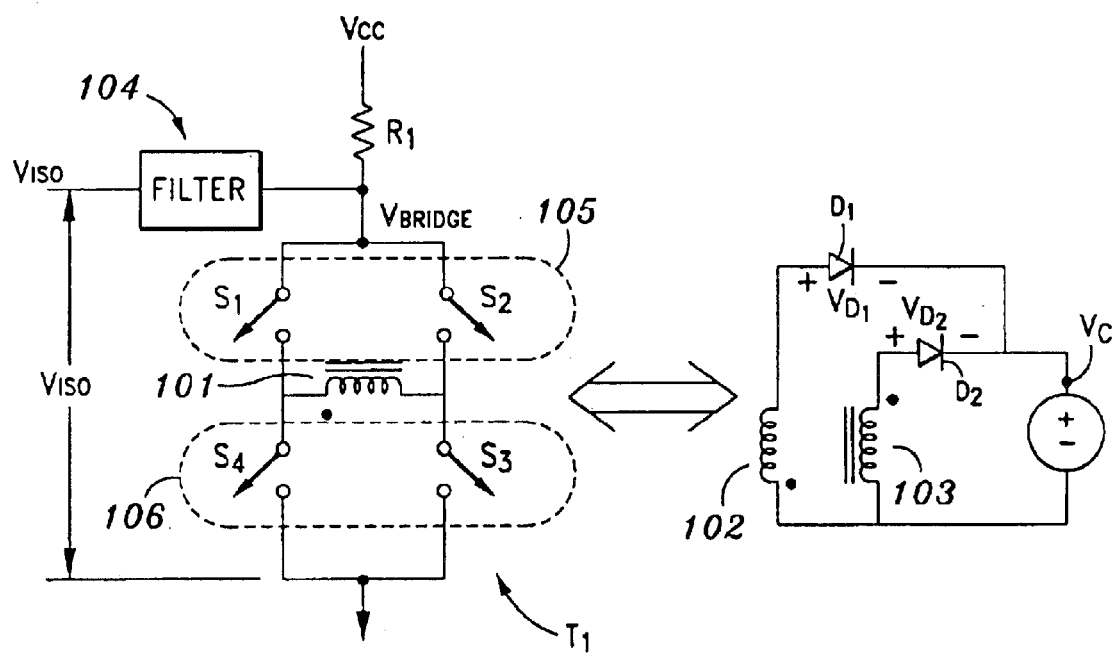
FIG. 1 is a schematic diagram showing the exemplary embodiment of the present invention.

FIG. 1 is a schematic diagram showing an exemplary embodiment of the present invention. In the exemplary embodiment, transformer T1 consists of a single primary winding 101, and two secondary windings 102–103. The transformer secondaries, and diodes D1 and D2, are configured in, for example, a full wave arrangement. However, the transformer secondaries and rectifiers can be arranged in any other configuration, for example, a half-wave arrangement. This can be determined by the objectives of a particular application. In the exemplary embodiment, diodes D1 and D2 function as rectifiers. The cathode of the diodes are connected to a controlled voltage Vc.

In the exemplary embodiment, the primary coil 101, is driven alternately in polarity, with the voltage Vbridge. This causes a switching action that is similar to a full bridge circuit, operating substantially close to 100% duty cycle. The duty cycle of the bridge circuit can be chosen to be any amount, depending on the objectives of a particular application. In the exemplary embodiment, the duty cycle is chosen to be substantially close to 100% so that voltage Vc will be fully transferred to the primary side voltage Viso. This allows the voltage Vc to be transferred to Viso without any mechanical contacts.

In another exemplary embodiment, if switches S1 and S3 are on, switches S2 and S4 are off. The opposite is also true. The switches are timed so that they do not operate simultaneously in order to avoid significant stress. Any type of switches can be used, for example, a plurality of D- flip flops 105 or a plurality of transistors 106. However, any type of switch can be used, and can be determined according to a particular application. In order to preclude switching stress, a small "dead time," for example, 50 nanoseconds, can be provided by drive circuits. This "dead time"

may cause noise, but typically, this noise has very frequency components. In the exemplary embodiment, this high frequency noise can be substantially reduced by using a filter 104, for example, a R-C filter. However, this is just one example. Other filters or methods of removing noise can be used, and can be determined according to a particular application.

In the exemplary embodiment, the voltage appearing at the Vbridge node, when the switches are conducting, is directly proportional to the voltage Vc plus the diode drop from D1, D2, or other essentially fixed voltage drops in the switching path. In this way, isolated signal transfer from Vc to Vbridge is achieved. In the exemplary embodiment, the voltage at Vbridge can follow the voltage at Vc with high precision in both increasing and decreasing directions without distortion. In a preferred embodiment, the voltage at Vbridge is desired to be a substantially exact replica of the control voltage Vc. However, the components of the exemplary embodiment typically add a substantially small amount of error. In addition, a 100% duty cycle is not always practical. However, the voltage at Vbridge should be a substantially similar replica of the control voltage Vc. In the FIG. 1 embodiment, a resistor R1 is included to provide, for example, primary transformer current, current limiting between Vcc and Vbridge, and to serve as a filtering component.

Figure 2:
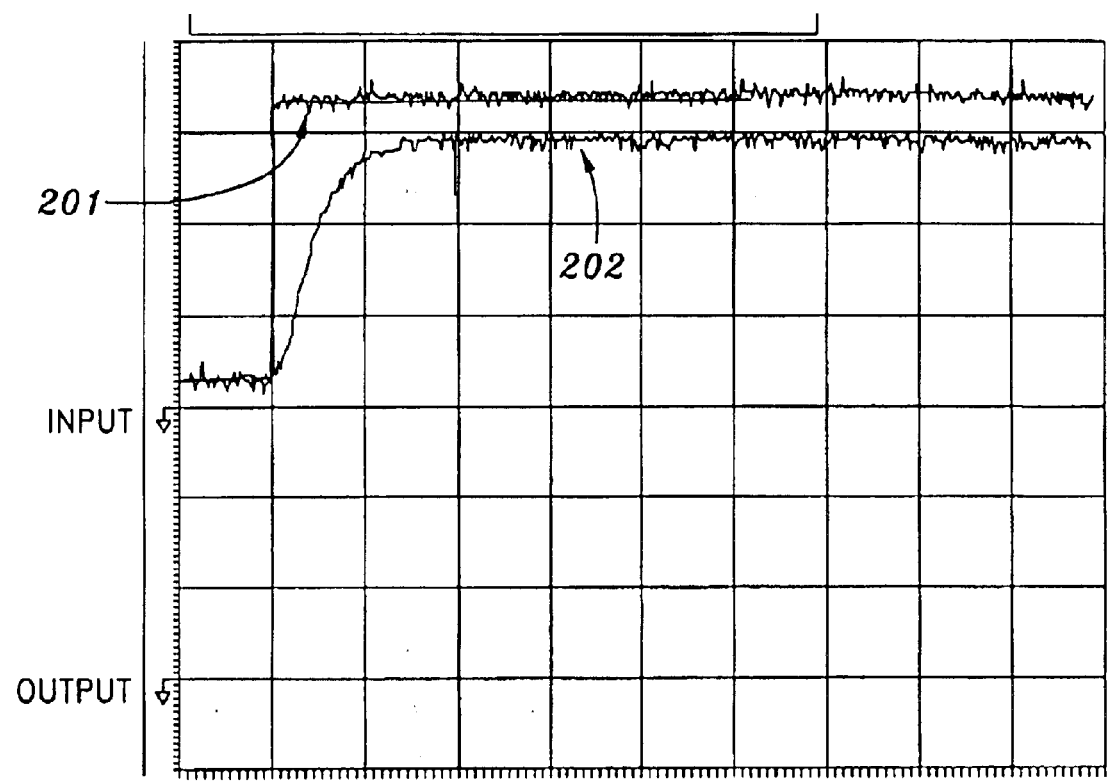
FIG. 2 is a graph showing the step response and the rising edge delay of the exemplary embodiment of the present invention.
Figure 3:
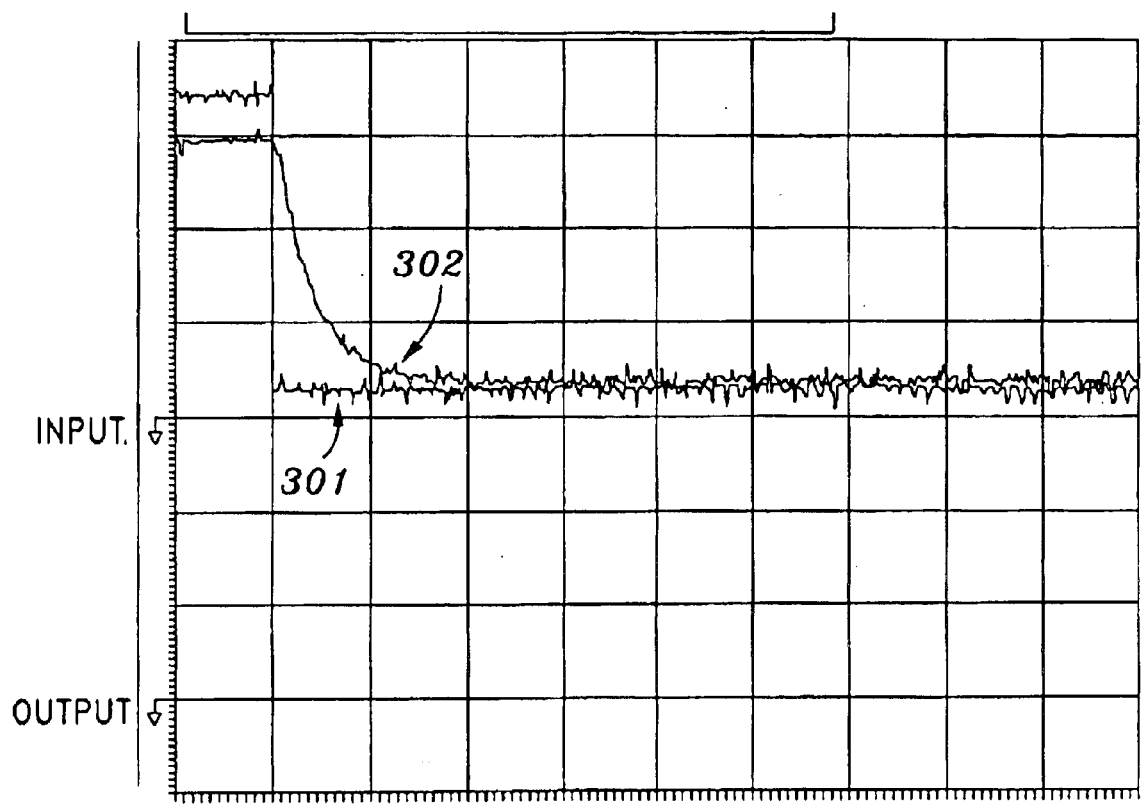
FIG. 3 is a graph showing the step response and the falling edge delay of the exemplary embodiment of the present invention.

Several waveforms can be used in order to demonstrate the operation of the exemplary embodiment. FIGS. 2 and 3 are graphs showing the step response of the exemplary embodiment of the present invention. Two exemplary signals are shown in FIGS. 2 and 3. FIGS. 2 and 3 show a comparison of an input voltage, Vin (201 and 301), with the generated replica at Viso (202 and 302). From the FIG. 2 and 3 graphs, it is apparent that the signals (202 and 302) are a substantially similar replica of the input signal (201 and 301). However, the step signal (202 and 302) has a smaller peak to peak voltage than the input step voltage (201 and 301). In the exemplary embodiment, this attenuation in voltage is caused by the voltage divider action of R1 and parasitic circuit resistances. In addition, any switches (D1, D2, S1, S2, S3, S4) that are used in an embodiment, for example, transistors, can cause an offset in the voltage at the output, Viso. Other components, or circuits can cause voltage drops in the output signals (202 and 302). However, the output signals (202 and 302) should always remain a substantially similar replica of the input signal (201 and 301).

With reference to FIGS. 2 and 3, the response of the exemplary embodiment of the present invention to rising and falling edge waveforms is discussed. A rising edge signal can also be used to test the exemplary embodiment of the present invention. FIG. 2 is a graph showing the rising edge delay of the exemplary embodiment of the present invention. The input signal is represented by waveform 201. The output waveform 202, is shown in FIG. 2. There is a delay of approximately two microseconds in the exemplary embodiment. In the exemplary embodiment, substantially no ringing occurs in the output waveform 202. The voltage of the output signal 202 is slightly lower, however, due to the factors discussed with reference to FIGS. 2 and 3. The response of the exemplary embodiment to a falling edge is shown in FIG. 3. The input waveform 301 is a falling edge signal. The representative signal at the output is shown by waveform 302. Similar to the response to the rising edge signal, the output of the falling edge signal 301 is delayed by approximately two microseconds. The voltage of the signal 302 is lower, as discussed with reference to FIG. 2.

Figure 4:
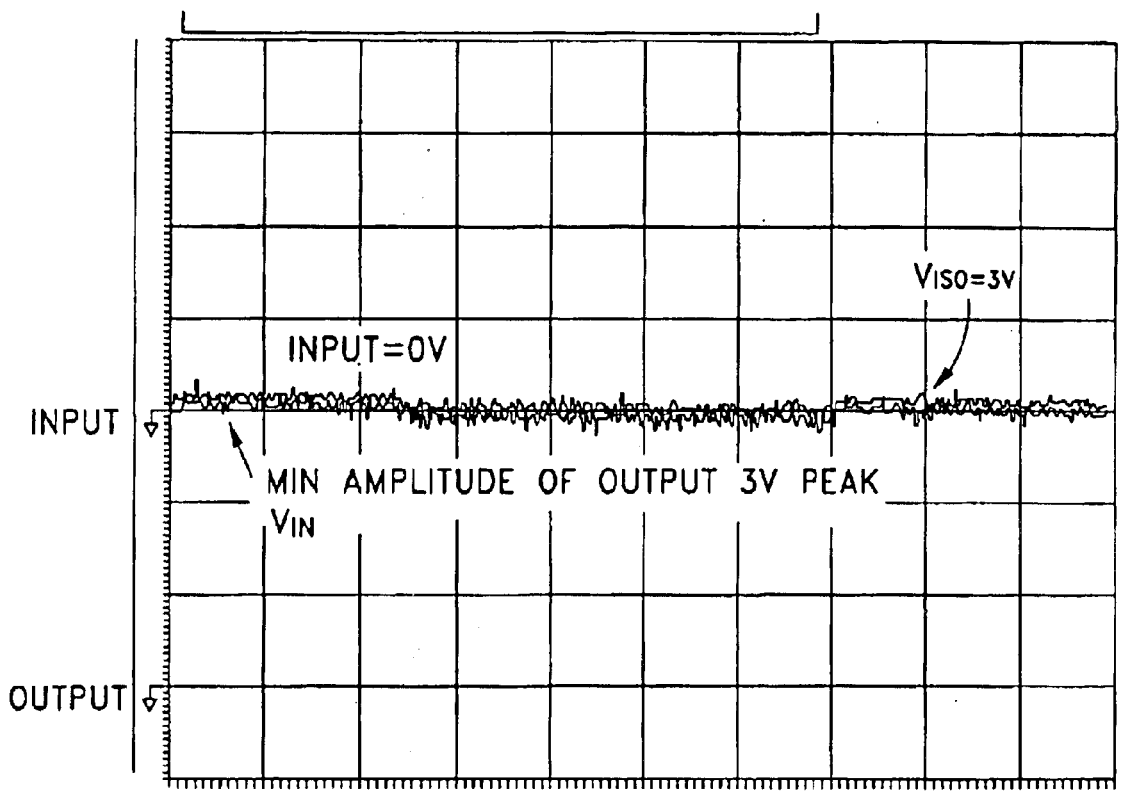
FIGS. 4 and 5 are graphs showing the dynamic range of the exemplary embodiment of the present invention.
Figure 5:
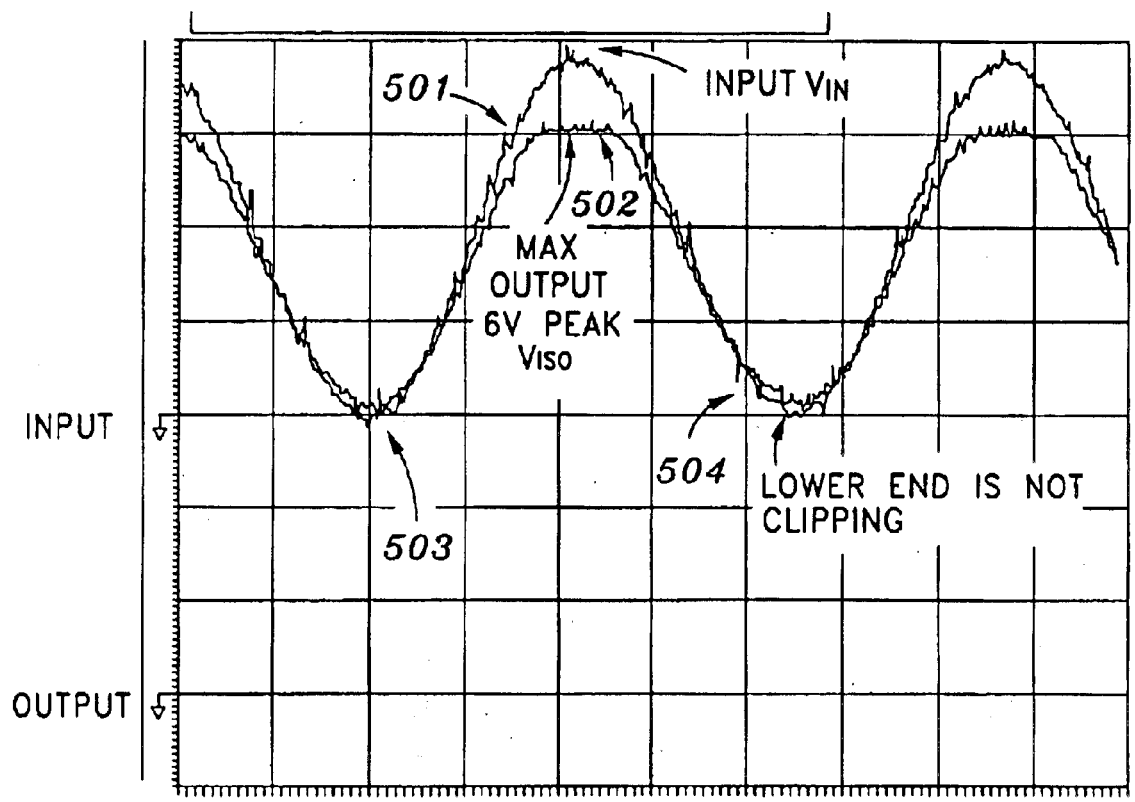

With reference to FIGS. 4 and 5, the dynamic range of the exemplary embodiment of the present invention is discussed. FIG. 4 is a graph showing the dynamic range of the exemplary embodiment of the present invention. In the exemplary graph shown in FIG. 4, an input waveform that is substantially equal to zero volts is used. In the exemplary graph, the output is zero plus the offset voltage, which is three volts. The resultant output waveform is substantially a replica of the input waveform.

FIG. 5 is another graph showing the dynamic range of the exemplary embodiment of the present invention. The input signal in the FIG. 5 graph is a sinusoidal waveform 501. This graph shows the response of the exemplary embodiment to a real-time waveform. The waveform 501 is replicated at the output Viso (FIG. 1). In the exemplary graph, the input is purposely overdriven to show the upper end of the exemplary circuits (FIG. 1) dynamic range. The FIG. 5 graph shows that the circuit is well behaved when driven outside of its dynamic range. In addition, the response is still linear, and not clipping, with zero volts applied. This operation differs from typical circuits which do not work with zero volts applied to their inputs.

Figure 6:
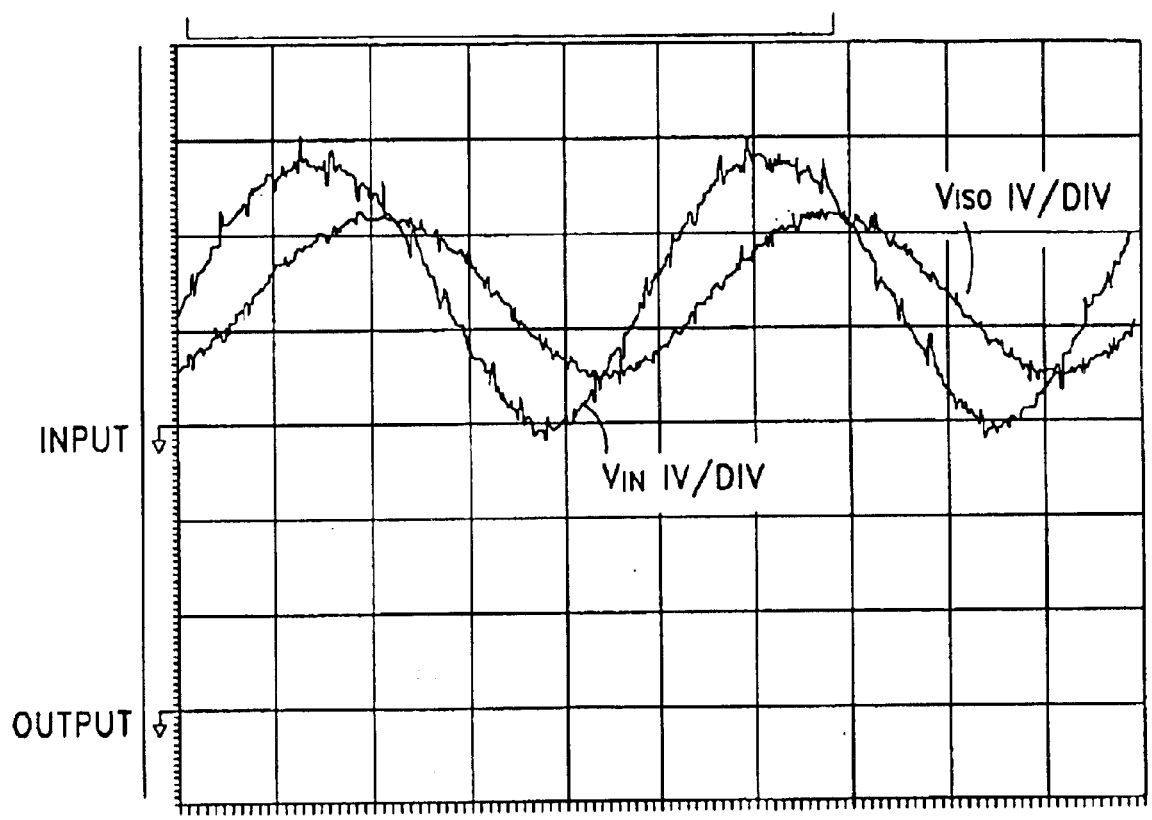
FIG. 6 is a graph showing the bandwidth of the exemplary embodiment of the present invention.

FIG. 6 is a graph showing the bandwidth of the exemplary embodiment of the present invention. In the exemplary embodiment, the bandwidth can be determined as it is defined according to a typical R-C network. In networks such as these, bandwidth is defined according to when the input and the output have a 45 degree phase shift. Using this method, the bandwidth for the present invention can be determined to be, for example, 200 KHz.

Figure 7:
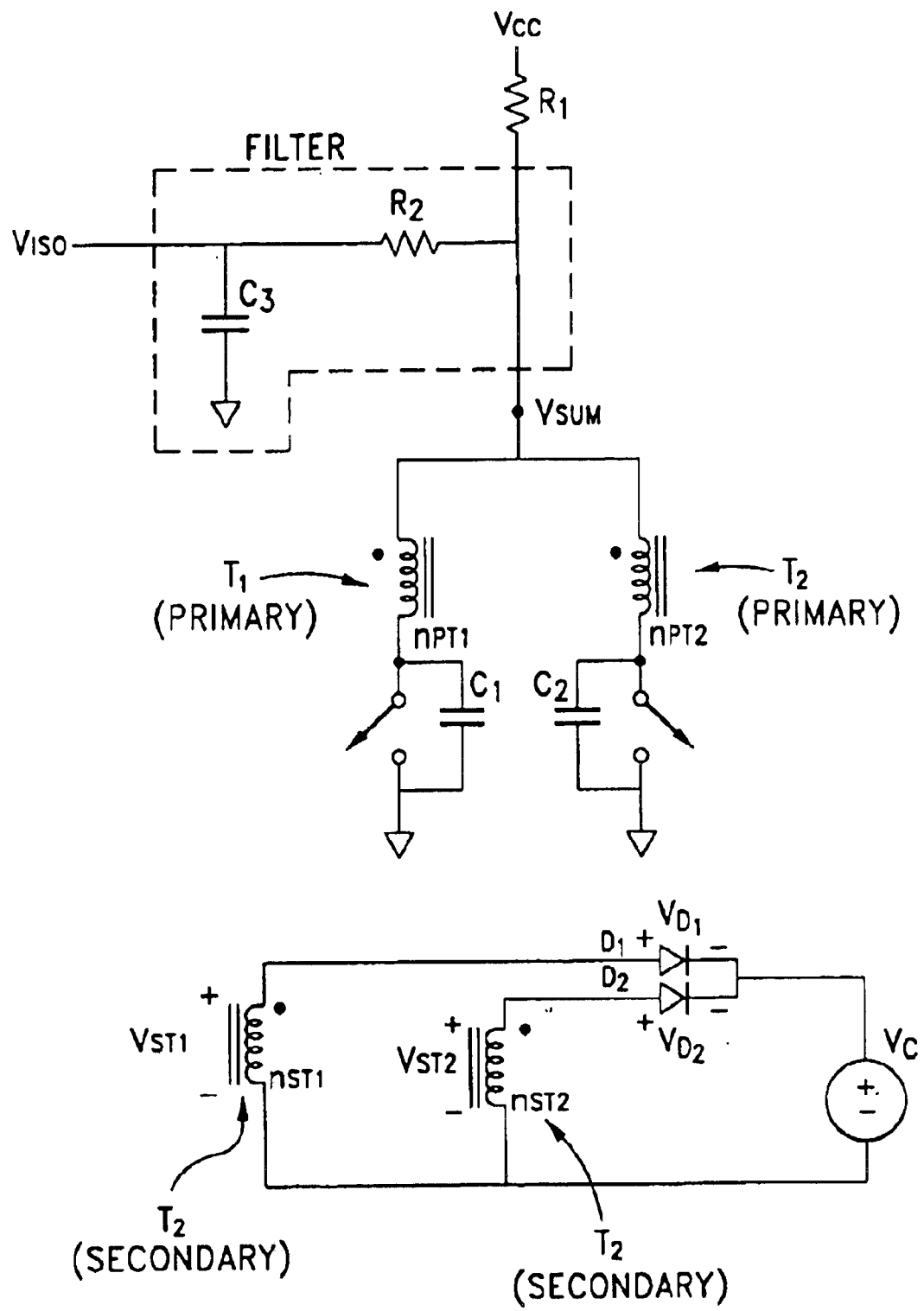
FIG. 7 is a schematic diagram of an alternate embodiment of the present invention.

FIG. 7 is a schematic diagram showing another embodiment of the present invention. The operation of the FIG. 7 embodiment is substantially similar to the operation of the embodiment shown in FIG. 1. However, in the FIG. 7 embodiment, two separate transformers are employed. By using two separate transformers, the signal transfer can be improved because there is no "dead time," as described with reference to FIG. 1. By using two separate transformers, each switching at greater than 50% duty cycle, the signal transfer can be seamless. In other words, information is substantially always being transferred.

Although the invention has been described with reference to particular embodiments, it will be understood to those skilled in the art that the invention is capable of a variety of alternative embodiments within the spirit of the appended claims.

What is claimed is:

1. An apparatus for transmitting a signal across an interface, comprising:
    an isolation circuit configured to receive at least one input signal, said isolation circuit further comprising:
    a primary winding;
    a first secondary winding in inductively coupled to the primary winding; and
    a second secondary winding inductively coupled to the primary winding;
    a rectifier connected to said isolation circuit; and
    a switching system connected to said primary winding, for providing an output, said switching system further comprising alternatively operating pairs of switches.

2. The apparatus according to claim 1, wherein said isolation circuit comprises a transformer.

3. The apparatus according to claim 1, wherein said output is substantially similar to said input signal.

4. The apparatus according to claim 1, wherein said rectifier comprises one or more diodes.

5. The apparatus according to claim 4, wherein said rectifier said first secondary winding, and second secondary winding are arranged in a full wave configuration.

6. The apparatus according to claim 1, further comprising a filtering circuit.

7. The apparatus according to claim 6, wherein said filtering circuit comprises an R-C filter.

8. The apparatus according to claim 1, wherein said switching system comprises one of a plurality of transistors and a plurality of flip flops.

9. A circuit for transmitting a signal across an interface, comprising:
    an isolation circuit configured to receive at least one input signal, the isolation circuit further comprising:
    a first winding;
    a second winding, wherein said first winding and said second winding have a common input node configured to receive the input signal,—wherein the start of the first and second windings begins after the common input node—;
    a third winding inductively coupled to said first winding;
    a fourth winding inductively coupled to said second winding;
    a rectifier connected to said isolation circuit, said rectifier further comprising:
    a first diode having an input connected to said fourth winding, wherein an output of said first diode and an output of said second diode define a common return node; and
    a switching system to provide the output, said switching system further comprising a firsts witch connected to an end of said first winding obverse to the common input node, and a second switch connected to an end of said second winding obverse to the common input node.

10. The circuit of claim 9, further comprising a power source configured to supply the input signal.

11. The circuit of claim 9, wherein the common return node is coupled to a return node of the power source.

12. The circuit of claim 9, wherein the common input node is coupled to a source node of the power source.

13. The circuit of claim 7, wherein said switching system includes one of a plurality of transistors and a plurality of flip flops.

* * * * *

UNITED STATES PATENT AND TRADEMARK OFFICE
CERTIFICATE OF CORRECTION

PATENT NO.    : 6,924,713 B2
DATED         : August 2, 2005
INVENTOR(S)   : John Donald Repp It is certified that error appears in the above-identified patent and that said Letters Patent is hereby corrected as shown below:

Column 6,
Line 12, "—wherein" should read -- wherein --.
Line 14, "node—;" should read -- node; --.
Line 26, "the output" should read -- an output --.
Line 27, "firsts witch" should read -- first switch --.
Line 38, "claim 7" should read -- claim 9 --.

Signed and Sealed this

Eleventh Day of October, 2005

JON W. DUDAS
*Director of the United States Patent and Trademark Office*